United States Patent
Chiu et al.

(10) Patent No.: US 9,130,113 B2
(45) Date of Patent: Sep. 8, 2015

(54) METHOD AND APPARATUS FOR RESISTIVITY AND TRANSMITTANCE OPTIMIZATION IN TCO SOLAR CELL FILMS

(71) Applicant: TSMC Solar Ltd., Taichung (TW)

(72) Inventors: Yung-Sheng Chiu, Fuxing Township (TW); Chun-Heng Chen, Hsinchu (TW); Tzu-Huan Cheng, Kaohsiung (TW); Chien-Yao Huang, New Taipei (TW)

(73) Assignee: TSMC Solar Ltd., Taichung (TW)

( * ) Notice: Subject to any disclaimer, the term of this patent is extended or adjusted under 35 U.S.C. 154(b) by 0 days.

(21) Appl. No.: 13/714,823

(22) Filed: Dec. 14, 2012

(65) Prior Publication Data
US 2014/0170804 A1    Jun. 19, 2014

(51) Int. Cl.
*H01L 21/44* (2006.01)
*H01L 31/18* (2006.01)

(52) U.S. Cl.
CPC .............. *H01L 31/1884* (2013.01); *Y02E 10/50* (2013.01)

(58) Field of Classification Search
CPC .............. H01L 31/1884; H01L 31/042; H01L 31/022466; H01L 21/0392; H01L 21/14; H01L 31/206
USPC ....................... 438/95, 116, 608; 257/21, 431, 257/E33.001, 43
See application file for complete search history.

(56) References Cited

U.S. PATENT DOCUMENTS

| | | | |
|---|---|---|---|
| 3,599,059 A | 8/1971 | Hou | |
| 4,152,535 A | 5/1979 | Deminet et al. | |
| 4,873,198 A | 10/1989 | Meyers et al. | |
| 4,935,383 A | 6/1990 | Nouhi et al. | |
| 6,576,112 B2 | 6/2003 | Sonoda et al. | |
| 6,683,695 B1 * | 1/2004 | Simpson et al. | 356/632 |
| 6,770,143 B2 * | 8/2004 | Zhang et al. | 118/715 |
| 7,141,449 B2 | 11/2006 | Shiozaki | |
| 8,298,849 B2 | 10/2012 | Ding et al. | |
| 8,309,390 B2 | 11/2012 | Lerchenberger et al. | |
| 8,354,586 B2 | 1/2013 | Thomsen et al. | |
| 8,361,826 B2 | 1/2013 | Kim et al. | |

(Continued)

FOREIGN PATENT DOCUMENTS

| | | |
|---|---|---|
| CN | 102459110 A | 5/2012 |
| TW | 201044482 A1 | 12/2010 |

OTHER PUBLICATIONS

Villaneuva, J. "Radiation from the Sun", Universetoday.com article Mar. 19, 2010, 6 pages.

(Continued)

*Primary Examiner* — Jarrett Stark
*Assistant Examiner* — Shahed Ahmed
(74) *Attorney, Agent, or Firm* — Duane Morris LLP

(57) ABSTRACT

A method and system provide for depositing a TCO, transparent conductive oxide, film in one chamber of a manufacturing tool then irradiating the TCO film with light energy in another chamber of the same tool. The TCO film is used in a solar cell and formed on a solar cell substrate in some embodiments. The method includes irradiating the TCO film for a time and energy to reduce resistance of the TCO film without reducing transmittance. One or multiple light sources are used in the light irradiation chamber. Light in the infrared range, visible light range and ultraviolet light range are used either individually or in combination.

15 Claims, 7 Drawing Sheets

(56) References Cited

U.S. PATENT DOCUMENTS

| | | |
|---|---|---|
| 8,394,659 B1 | 3/2013 | Ding et al. |
| 8,633,476 B2 | 1/2014 | Kim et al. |
| 8,728,855 B2 | 5/2014 | Korevaar et al. |
| 2004/0247779 A1 | 12/2004 | Seivamanickam et al. |
| 2009/0205707 A1 | 8/2009 | Ikenoue et al. |
| 2010/0073011 A1* | 3/2010 | Svidenko et al. ............ 324/537 |
| 2010/0109058 A1 | 5/2010 | Sakata et al. |
| 2010/0184249 A1 | 7/2010 | Chen |
| 2010/0210064 A1 | 8/2010 | Hakuma et al. |
| 2010/0224247 A1 | 9/2010 | Bartholomeusz et al. |
| 2010/0267190 A1 | 10/2010 | Hakuma et al. |
| 2011/0204045 A1* | 8/2011 | Moffatt ......................... 219/678 |
| 2011/0263072 A1 | 10/2011 | Lee et al. |
| 2012/0094075 A1 | 4/2012 | Peter et al. |
| 2012/0174957 A1 | 7/2012 | Nishimura et al. |
| 2012/0180869 A1 | 7/2012 | Jee et al. |
| 2012/0237695 A1* | 9/2012 | Pye et al. ..................... 427/554 |
| 2012/0319090 A1* | 12/2012 | Shinkai et al. .................. 257/40 |
| 2012/0329195 A1 | 12/2012 | Leidholm et al. |
| 2013/0061903 A1 | 3/2013 | Mitzi et al. |
| 2013/0089944 A1 | 4/2013 | Rhieu |
| 2013/0129878 A1* | 5/2013 | Tzioumakis et al. ......... 426/250 |
| 2013/0139878 A1* | 6/2013 | Bhatnagar et al. ............ 136/256 |
| 2013/0171757 A1 | 7/2013 | Ponnekanti et al. |
| 2013/0206222 A1* | 8/2013 | Ha et al. ....................... 136/256 |
| 2013/0306150 A1 | 11/2013 | Dounas et al. |
| 2013/0327391 A1 | 12/2013 | Gloeckler et al. |
| 2013/0327393 A1 | 12/2013 | Lee et al. |
| 2014/0076392 A1 | 3/2014 | Lin et al. |
| 2014/0109949 A1 | 4/2014 | Avellan et al. |
| 2014/0120649 A1 | 5/2014 | Nakahama et al. |
| 2014/0127851 A1 | 5/2014 | Yamamoto et al. |
| 2014/0134784 A1 | 5/2014 | Lin et al. |
| 2014/0134838 A1 | 5/2014 | Gossman et al. |
| 2014/0273313 A1 | 9/2014 | Kumar et al. |
| 2014/0287551 A1 | 9/2014 | Wieting |
| 2014/0363918 A1 | 12/2014 | Cheng et al. |

OTHER PUBLICATIONS

Pern, J., "Module Encapsulation Materials, Processing and Testing" available online from www.nrel.gov/docs/fy09osti/44666.pdf as of Jun. 11, 2011, pp. 1-33.

Zhu-Ge, F. et al., "Electrical and optical properties of Al-N co-doped p-type zinc oxide films", Journal of Crystal Growth, 2004, 268:163-168.

Oladeji I.O. et al., "Optimization of Chemical Bath Deposited Cadmium Sulfide Thin Films," J. Electrochem. Soc., Jul. 1997, 144(7):2342-2346.

Lany, S. et al., "Light- and bias-induced metastabilities in Cu(In,Ga)Se2 based solar cells caused by the (VSe-VCu) vacancy complex", J. Appl. Phys. 2006, 100:113725-1-15.

Official Action issued Apr. 29, 2015 in counterpart Taiwan Patent Application.

\* cited by examiner

METHOD AND APPARATUS FOR RESISTIVITY AND TRANSMITTANCE OPTIMIZATION IN TCO SOLAR CELL FILMS

TECHNICAL FIELD

The disclosure relates most generally to solar cell devices and, more particularly, to an apparatus and methods for forming transparent conductive oxide, TCO, and other films and for optimizing resistivity and transmittance in such films.

BACKGROUND

Solar cells are photovoltaic components for direct generation of electrical current from sunlight. Due to the growing demand for clean sources of energy, the manufacture of solar cells has expanded dramatically in recent years and continues to expand. Transparent conductive oxide, TCO, films are commonly used in solar cells due to their versatility as transparent coatings and also as electrodes. As such, the TCO films have a high transmittance and a low resistivity to serve their multiple purposes. Previous methods and techniques for attempting to optimize both transmittance and resistivity without introducing contamination or incurring severe cost increases, have not been wholly successful. In many cases, reducing resistance by adding dopants causes an undesirable decrease in transmittance.

One approach is to provide a metallic grid on the surface of the solar cell to decrease resistivity, but this comes at the expense of transmittance because the metal used in such grids is not transparent. The lower transmittance decreases the amount of electricity generated from sunlight, which is directly proportional to the solar cell area available for sunlight absorption. The dopants that have been tried as additives to the TCO to decrease resistance typically degrade the transmittance of the TCO especially in the long wavelength region.

Other attempts to optimize the TCO film effectiveness, i.e. minimizing resistance while maximizing transmittance, have also not been fully successful.

There is therefore a need in the art that addresses the conventional shortcomings and limitations of present methods and techniques and provides transparent conductive oxide films with suitably low resistance and high transmittance.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

The disclosure provides an apparatus and method for creating a transparent conductive oxide (TCO) film on a solar cell or other substrate, in a first chamber of the apparatus then treating the solar cell substrate including the TCO film, in another chamber of the same apparatus by exposure to light energy. The exposure to light energy occurs after the film has been deposited or otherwise formed in another chamber. The exposure to light energy has been found to reduce the resistivity of the TCO film without degrading transmittance of the TCO film. Different light energies are used depending on the nature of the TCO film and the nature of the structure being irradiated. The wavelengths of light used may depend on the interface or interfaces formed between the TCO film and another material such as a glass or flexible substrate, or the interface between the TCO film and the stack of solar cell films, i.e. the films that combine to form the photovoltaic solar cell. The exposure to light energy after film formation lowers resistivity of the TCO film without reducing transmittance. Because the operations take place in separate chambers, cross-contamination issues are reduced. Without being bound to a particular theory, Applicants believe that light-induced metastabilities are formed in the TCO layer and other layers of the solar cells, particularly the adjacent layers, that reduce electrical resistance.

Figure 1:
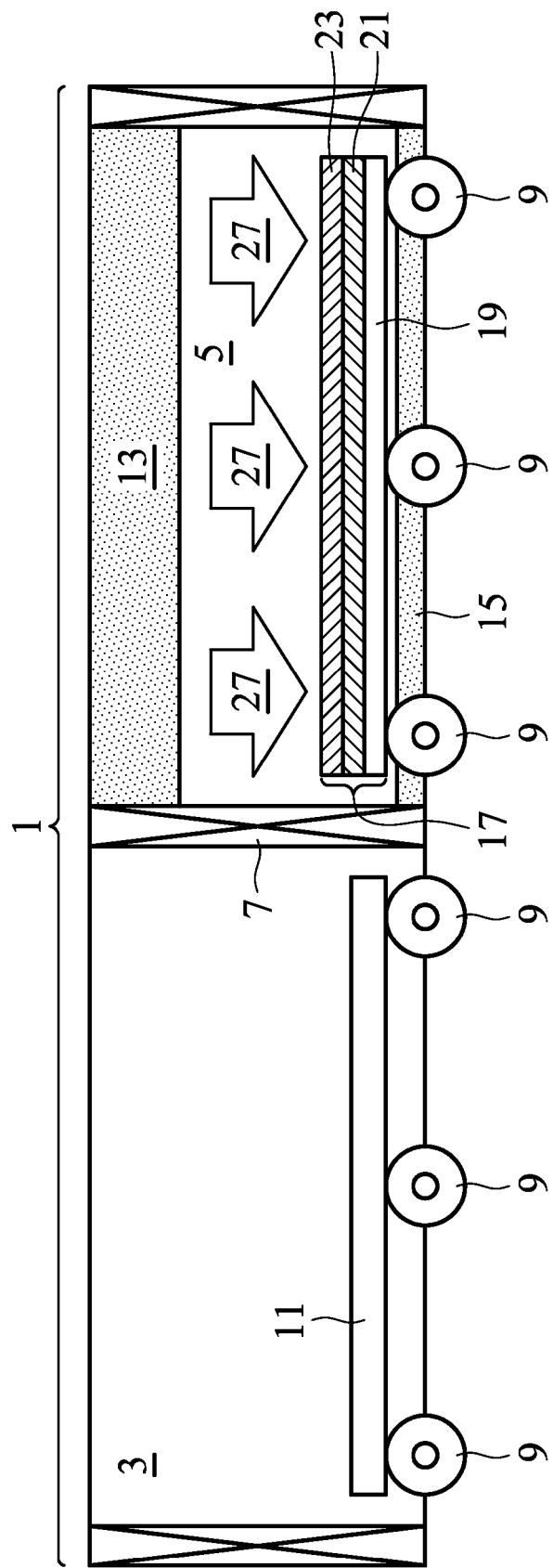
FIG. 1 is a side view in partial cross-section, showing a manufacturing tool including multiple chambers and illustrating one aspect of a method used to irradiate a deposited TCO film with light energy.

FIG. 1 is a side view showing apparatus 1 which is a manufacturing apparatus or tool used in the manufacture of semiconductor devices, solar cells, or other products. Apparatus 1 includes internal chambers 3 and 5, and may also include additional chambers. Chamber 3 is a deposition chamber. In one embodiment, chamber 3 is a chemical vapor deposition (CVD) chamber. In another embodiment, chamber 3 is an atmospheric pressure chemical vapor deposition (APCVD) chamber. In another embodiment, deposition chamber 3 is an atomic layer deposition (ALD) chamber. In another embodiment, deposition chamber 3 is a plasma enhanced chemical vapor deposition (PECVD) chamber, a metal organic chemical vapor deposition (MOCVD) chamber, or a sputtering chamber. Deposition chamber 3 may be various sizes. In one embodiment, deposition chamber 3 is a single substrate deposition chamber that deposits on one workpiece 11 and in another embodiment, deposition chamber 3 is a batch system that accommodates multiple substrates that undergo deposition simultaneously.

Deposition chamber 3 is used to deposit various types of films. Deposition chamber 3 is used to produce more than one film in various embodiments.

In one embodiment, deposition chamber 3 is used to deposit films on a semiconductor or solar cell substrate and in another embodiment, deposition chamber 3 is used to deposit film on other substrates. In some embodiments, deposition chamber 3 is used to deposit a transparent conductive oxide (TCO) film directly on a base substrate such as glass, plastic or a flexible material used in solar cells. In other embodiments, deposition chamber 3 deposits a TCO film over a series of solar cell films already formed on the base substrate. In some embodiments, the solar cell device is a CIGS, Cu(In, Ga)Se$_2$, type solar cell. Other solar cells are used in other embodiments. In some embodiments, deposition chamber 3 is used to deposit a TCO, transparent conductive oxide, film directly on a base substrate and then deposit a series of solar cell films over the TCO film.

In one embodiment, the deposited TCO film is indium tin oxide, ITO. In another embodiment, the deposited TCO film is ZnO. According to other embodiments, the TCO film is AZO (aluminum-doped zinc-oxide), BZO (boron-doped zinc-oxide), GZO (gallium-doped zinc-oxide) or indium-doped cadmium oxide or other suitable TCO films.

The deposition conditions and parameters are selected and controlled to produce the desired film or films having various thicknesses and other film characteristics. After the film or films are formed on workpiece 11 in deposition chamber 3, an internal transfer mechanism transfers workpiece 11 through valve 7 and into light irradiation chamber 5. In the illustrated embodiments, rollers 9 combine to form a track along which workpiece 11 rolls or slides and along which workpiece 11 is transferred between deposition chamber 3 and light irradiation chamber 5. In other embodiments, other internal transport mechanisms are used. The internal transport is carried out under vacuum conditions, in some embodiments, thereby preventing particle contamination.

Light irradiation chamber 5 includes upper light source 13, lower light source 15 and a support for a solar cell substrate therein. Light irradiation chamber 5 includes a support (not shown) for retaining solar cell 17 thereon or other devices for retaining solar cell 17.

Solar cell 17 includes base substrate 19. Base substrate 19 is formed of glass, plastic, flexible materials or other suitable materials in various embodiments. Solar cell films 21 are disposed on base substrate 19 and include various films such as one or more absorber layers. In one embodiment, solar cell films 21 form a CIGS-type solar cell. In other embodiments, solar cell films 21 form another type of solar cell. TCO layer 23 is disposed on solar cell films 21 in the illustrated embodiment of FIG. 1. TCO layer 23 is ITO in one embodiment and TCO layer 23 is one of ZnO, AZO, BZO, GZO or indium-doped cadmium oxide in other embodiments. TCO layer 23 is formed to various suitable thicknesses.

Each of upper light source 13 and lower light source 15 may irradiate solar cell 17. Each of upper light source 13 and lower light source 15 is powered by a suitable power source (not shown). In other embodiments, more than two light sources are used. In some embodiments, multiple upper light sources and/or multiple lower light sources are used and the different light sources may produce different kinds of light. In the illustrated embodiment of FIG. 1, arrows 27 indicate light energy directed from upper light source 13 toward solar cell 17 having TCO layer 23 as a top layer. In other embodiments, only lower light source 15 is activated to produce light energy. In another embodiment, both upper light source 13 and lower light source 15 are powered to produce light energy. In one embodiment, upper light source 13 and lower light source 15 produce light energy simultaneously and in another embodiment, upper light source 13 and lower light source 15 operate sequentially such that each is turned on and off a plurality of times.

Various light energies and wavelength ranges of light are used in various embodiments. In one embodiment, the light used includes an energy of about 0.9 eV to about 5.0 eV. The wavelength of light energy used to irradiate the workpiece, i.e. solar cell 17 in the illustrated embodiment, ranges from about 250 nm to about 1240 nm or from about 300 nm to about 1100 nm in some embodiments. In other words, the full energy range that is used includes visible light (generally about 1.7-3.3 eV or 380 nm to 740 nm), infrared light (generally about 1.7 eV or less or greater than 740 nm) and ultraviolet light (generally about 3-124 eV or about 10 nm to 400 nm). As such, in various embodiments, either or both of upper light source 13 and lower light source 15 produces visible light energy, infrared light energy and/or ultraviolet light energy. According to the embodiment (not shown) in which multiple upper light sources are used, one of the upper light sources produces one type of light, i.e. infrared, visible or ultraviolet, and the other upper light source produces another type of light in one embodiment. The same is true for an embodiment in which multiple lower light sources are present. In some embodiments, the upper light source 13 produces a higher energy light (shorter wavelengths) than the lower light source 15. For example, the upper light source 13 may be an UV light source and the lower light source 15 may be a visible light source.

The type of light that is used to soak or irradiate the deposited TCO or other film, is dependent upon the nature of the TCO or other film and the relationship of the film with other components of the solar cell. It has been found that light with energy greater than about 2.5 eV (blue light to uv light, $\lambda<500$ nm) improves the quality of the TCO film, the TCO interface with a glass base substrate and the interface between the TCO film and the solar cell films. It has also been found that light with energy less than about 1.9 eV (red light to near infrared, $\lambda>650$ nm) improves the quality of the entire solar cell. As such, various combinations and sequences of light within the full energy range of about 0.9 eV to about 5 eV and within the wavelength range of about 250 nm to 1240 nm is used, but other energies and wavelengths are used in other embodiments. In one embodiment, a first light having a first wavelength range is used for a first time period then a second light having a second wavelength range is used for a second time period and this sequence may be repeated in various embodiments. According to one embodiment, a light of a first wavelength range is produced by one of upper light source 13 and lower light source 15 and a light of a second wavelength range is produced by the other of upper light source 13 and lower light source 15. This light energy may be directed to solar cell 17 in an alternating and/or repetitive manner. A series of sequential irradiations of light energy is used in some embodiments.

Figure 2:
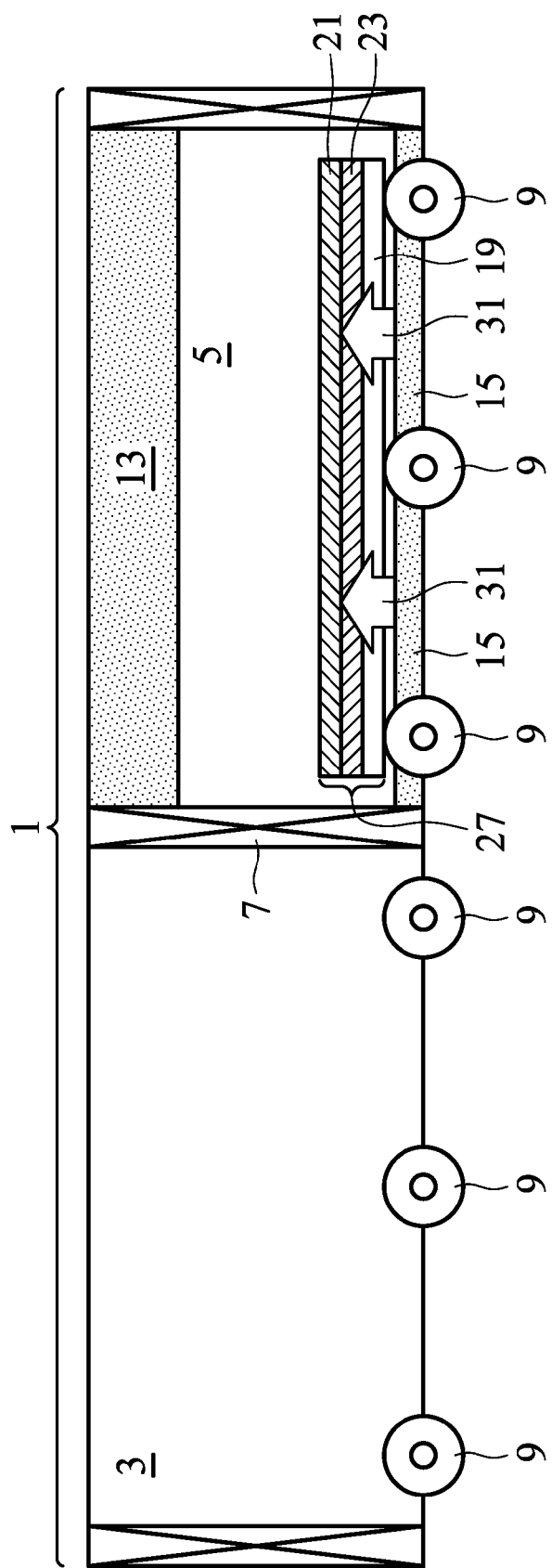
FIG. 2 is a side view in partial cross-section, showing a manufacturing tool including multiple chambers and illustrating another aspect of a method used to irradiate a deposited TCO film with light energy.

FIG. 2 shows another aspect of apparatus 1 and another method for irradiating a TCO or other film in a second chamber after it has been formed in a first chamber. Apparatus 1 includes deposition chamber 3 and light irradiation chamber 5, as described above. Solar cell 27 includes base substrate 19, TCO layer 23 formed over base substrate 19 and solar cell films 21 formed over TCO layer 23. According to this embodiment, base substrate 19 is formed of glass or another transparent substrate. In this manner, according to an embodiment in which only lower light source 15 is used, arrows 31 indicate light radiation from lower light source 15 directed upwardly toward solar cell 27 and which are transmitted through transparent base substrate 19 and irradiate TCO layer 23 from below. While FIG. 2 is provided to explicitly show light radiation from lower light source 15 to TCO layer 23 through transparent base substrate 19 from below, it should be understood that each of the light irradiation embodiments described above in conjunction with FIG. 1, are also available to irradiate solar cell 27, i.e. in the embodiment illustrated in FIG. 2 with solar cell 27 positioned in light irradiation chamber 5, multiple wavelengths of light, multiple energies of light, and multiple types of light, may be used. Upper light source 13 and lower light source 15 may be used at the same time or in sequence, and so forth.

The composite time and energy of light irradiation is chosen to sufficiently lower resistance of TCO layer 23 without adversely affecting its transmittance. Various light energies, various combinations of light energies and various times are used depending on the nature of the TCO layer, the type of solar cell, the nature of the base substrate, and the relationship between the TCO layer 23 and the other components of the solar cell.

Although described in conjunction with TCO films, the methods and apparatus configurations of the disclosure are used to form, then irradiate various other films and film composites formed on solar cell, semiconductor, and other substrates in various applications that benefit from the production of a TCO film in one chamber and the subsequent irradiation of the film to reduce resistance without reducing transmittance in another chamber.

Figure 3:
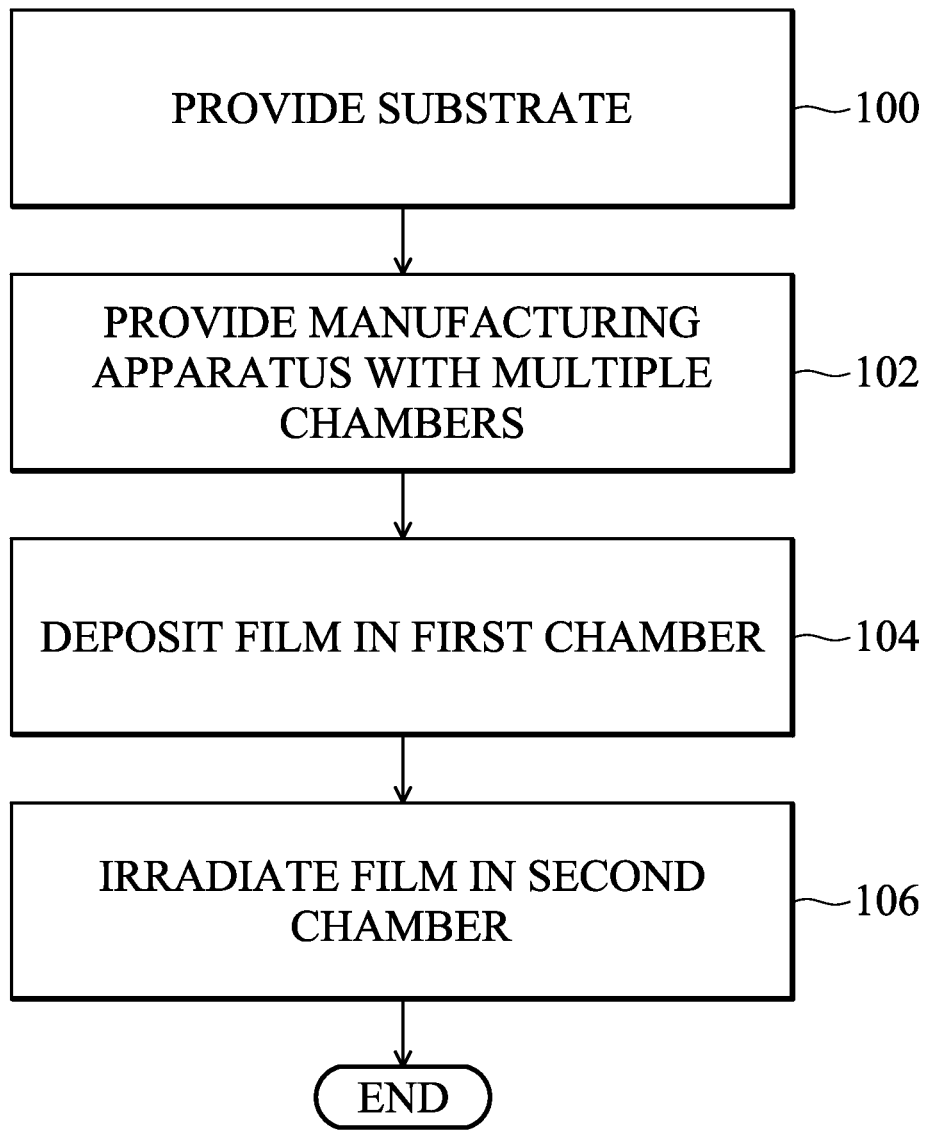
FIG. 3 is a flowchart illustrating an embodiment of a method according to the disclosure.

FIG. 3 is a flowchart showing a method according to the disclosure. At step 100, a substrate is provided. At step 102, an apparatus with multiple processing chambers is provided. At step 104, a substrate undergoes a deposition operation in a first chamber of a manufacturing apparatus having multiple processing chambers. The deposition operation may be the deposition of a TCO layer on a solar cell substrate according to some embodiments. Various deposition methods are used in various embodiments, as described above. At step 106, the substrate is moved into a second chamber, where a light irradiation operation takes place according to the embodiments described above. In various embodiments, the internal transfer of the substrate, i.e. workpiece from one chamber to another is done automatically and may be under vacuum, to prevent particle contamination.

Figure 4:
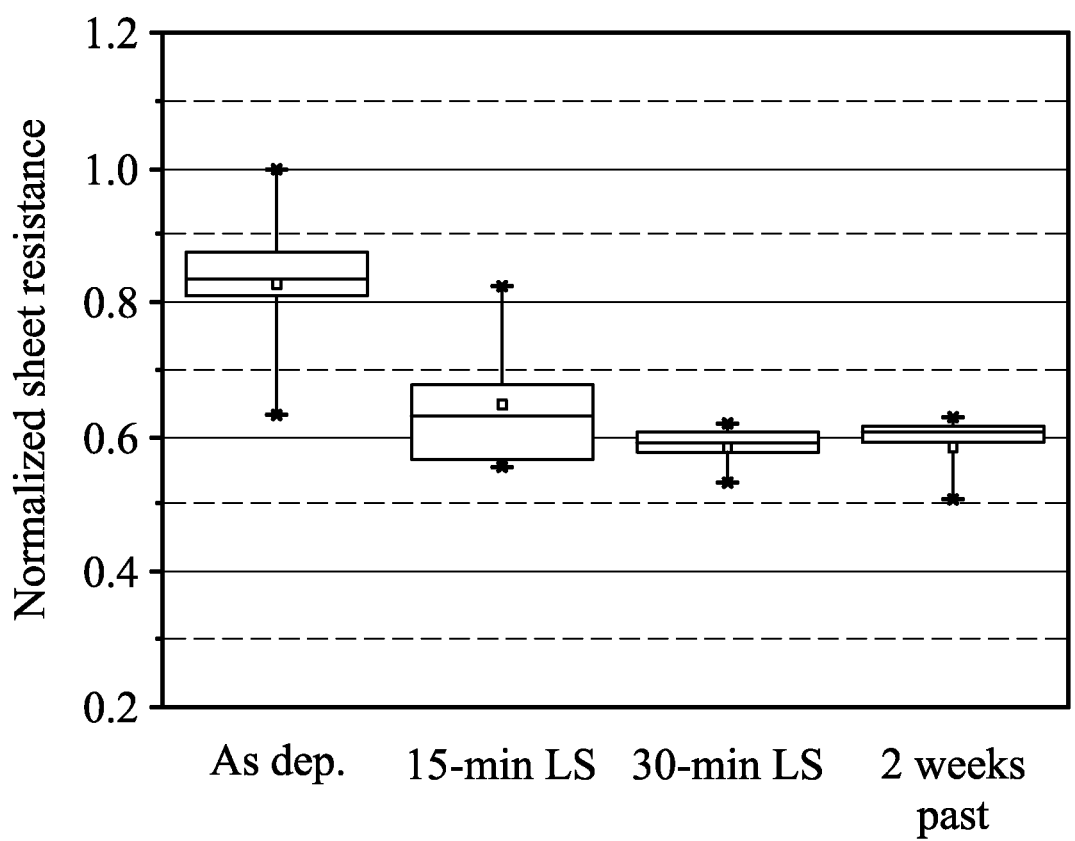
FIG. 4 is a graphical representation of normalized sheet resistance of a TCO film versus light soaking time.

FIG. 4 is a graphical representation showing normalized sheet resistance of a BZO, boron-doped zinc-oxide TCO film. FIG. 4 shows the sheet resistance of the BZO film as deposited, after 15 minutes of light soaking ("LS"), after 30 minutes of light soaking and two weeks after a 30 minute light soaking process. FIG. 4 shows significant improvement in sheet resistance of the BZO film as a result of the light soaking. The light soaking process is executed with 1000 W/m$^2$ illumination in the embodiment of FIG. 4, but other intensities are used in other embodiments. Sheet resistance is measured until the temperature is cooled down to room temperature (25° C.).

Figure 5:
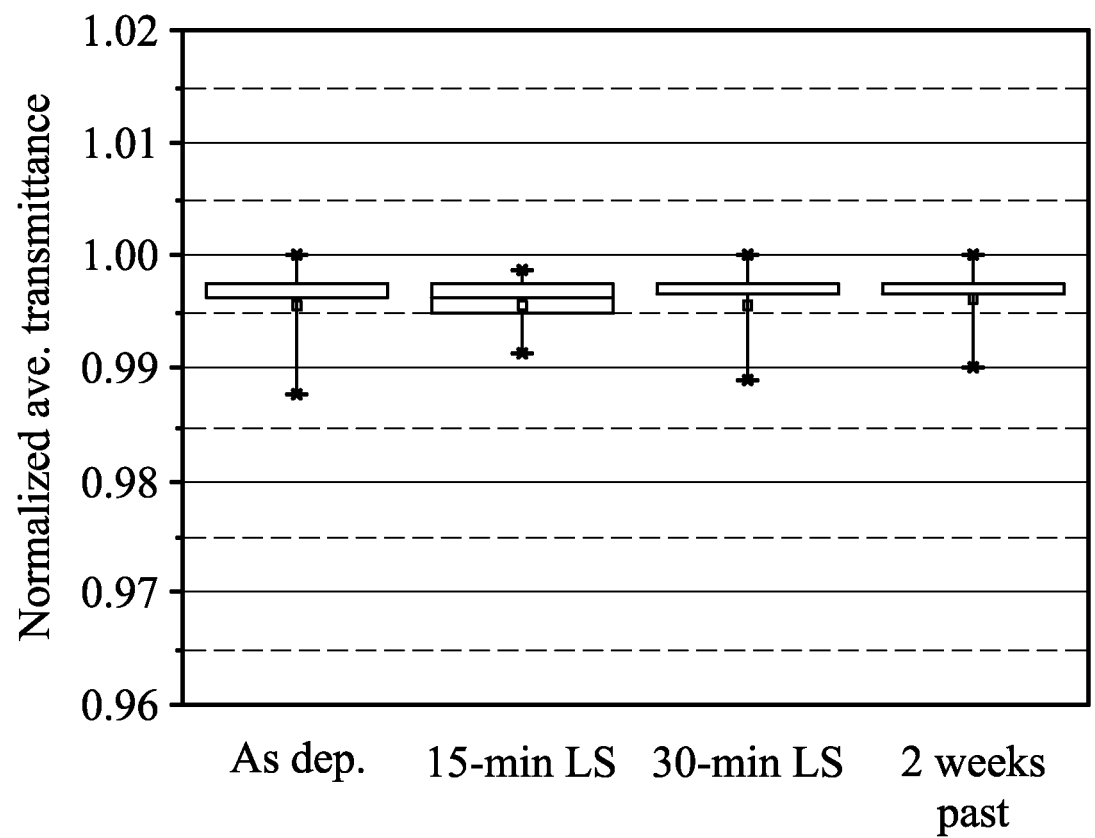
FIG. 5 is a graphical representation showing normalized average transmittance of a TCO film as a function of light soaking time.

FIG. 5 shows the effect on transmittance of the BZO film and shows that there is no apparent difference in transmittance in the BZO film before and after the light soaking process. FIG. 5 shows the transmittance remaining substantially the same, in the range between 0.995 and 1.00 transmittance.

Figure 6A:
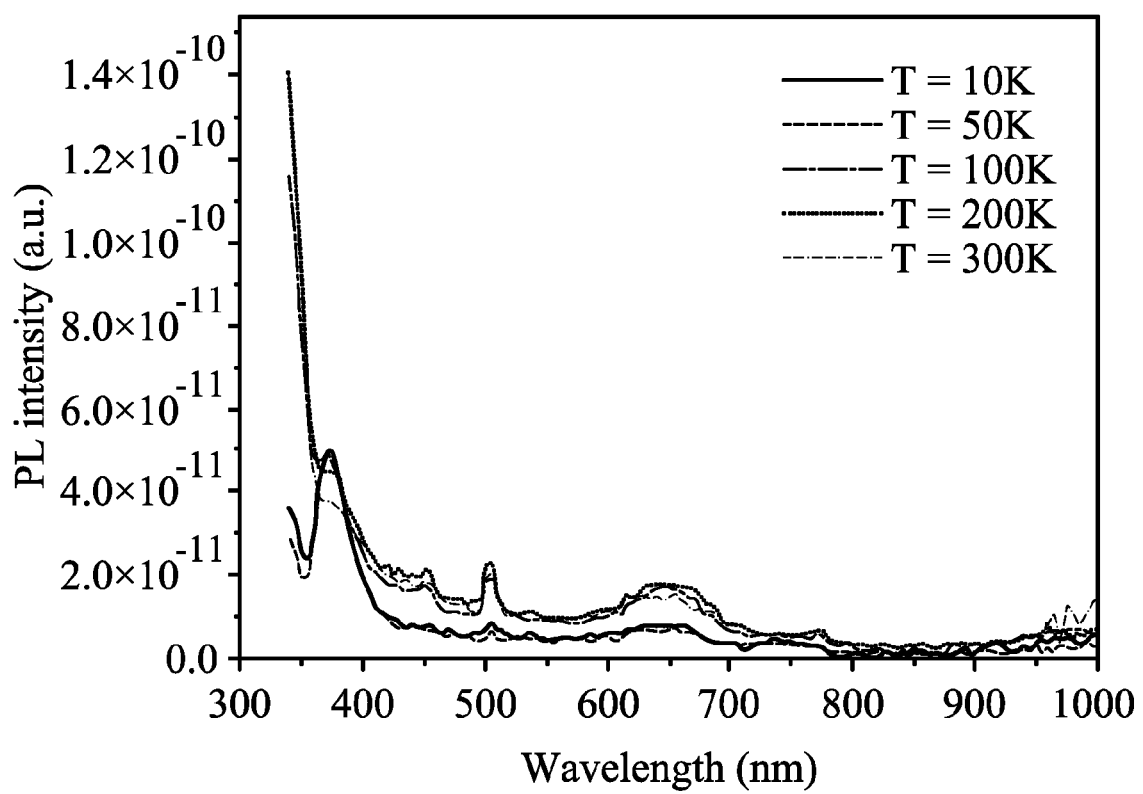
FIGS. 6A and 6B show photoluminescence of a TCO film before and after the light soaking operation.
Figure 6B:
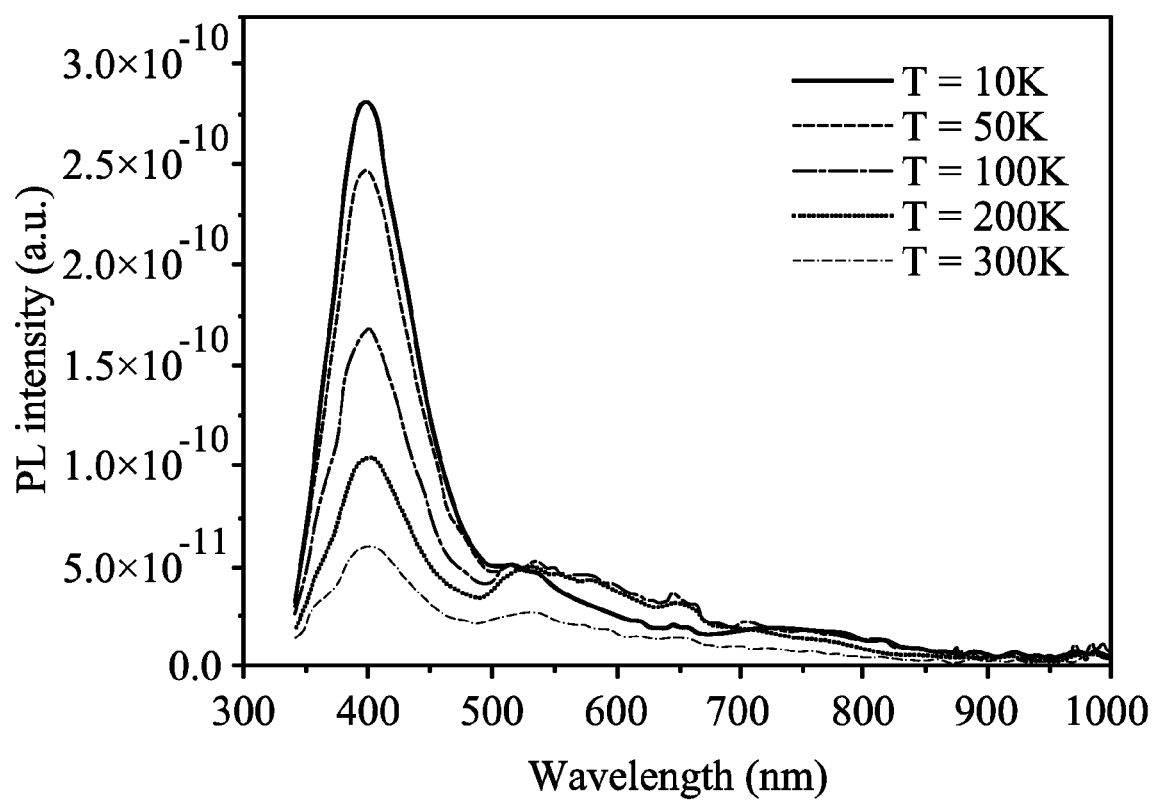

FIGS. 6A and 6B graphically show the results of one light soaking trial of a BZO film. FIGS. 6A and 6B graphically illustrate photoluminescence intensity FIGS. 6A and 6B graphically show the enhancement of photoluminescence (PL) in a BZO TCO film as a result of light soaking. FIGS. 6A and 6B graphically illustrate photoluminescence intensity, in arbitrary units (a.u.) at various wavelengths of light. FIG. 6A shows varied temperature photoluminescence analysis of an exemplary BZO film as deposited, i.e. prior to light soaking. FIG. 6B shows the same BZO film after being exposed to light at 1000 W/m$^2$ illumination for 30 minutes. FIG. 6B shows an increase in photoluminescence which is a measure of the BZO film absorbing and then re-radiating photons. Without being bound to a particular theory, Applicants believe that the increase in photoluminescence is due to an enhancement in the BZO layer due to light soaking, and in particular that the enhancement is due to light-induced metastables that are formed in the BZO layer and produce a high radiative recombination rate evidenced by an increase in photoluminescence intensity.

According to one aspect of the disclosure, a method for forming a solar cell is provided. The method comprises: providing a solar cell substrate; depositing at least one film on the solar cell substrate in a first chamber of a multi-chamber manufacturing apparatus; and exposing the solar cell substrate with the at least one film thereon, to light energy in a second chamber of the multi-chamber manufacturing apparatus According to another aspect of the disclosure, a method for forming a solar cell is provided. The method comprises: providing a solar cell substrate; depositing at least a TCO (transparent conductive oxide) film on the solar cell substrate in a first chamber of a multi-chamber manufacturing apparatus; and exposing the solar cell substrate with the at least the TCO film thereon, to at least one light source in a second chamber of the multi-chamber manufacturing apparatus, the exposing including exposing to multiple wavelengths of light.

According to yet another aspect of the disclosure, a manufacturing apparatus is provided. The manufacturing apparatus comprises: multiple chambers and an internal transfer mechanism that transfers substrates within the manufacturing apparatus and between the chambers, the multiple chambers including at least a deposition chamber for depositing thin films on a solar cell substrate and a light energy soaking chamber having at least one light source therein that directs light energy to a solar cell substrate in the light energy soaking chamber.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method for forming a solar cell, said method comprising:
provinding a solar cell substrate;
depositing at least one film on said solar cell substrate in a first chamber of a multi-chamber manufacturing apparatus, wherein said depositing at least one film comprises depositing a TCO (transparent conductive oxide) film; and
light soaking said solar cell substrate with said at least one film thereon after depositing the TCO film, in a second chamber of said multi-chamber manufacturing apparatus by exposing said solar cell substrate to a first light and a second light on opposite sides of said solar cell substrate,
wherein the first light or the second light is a light in the range of from red light to near infrared or in the range of from blue light to ultraviolet (UV) light.

2. The method as in claim 1, wherein said TCO film comprises ITO (indium tin oxide) and said solar cell substrate includes solar cell film layers disposed on a base substrate.

3. The method as in claim 1, wherein said TCO film comprises one of ZnO, AZO (aluminum-doped zinc-oxide), BZO (boron-doped zinc-oxide), GZO (gallium-doped zinc-oxide) and indium-doped cadmium oxide.

4. The method as in claim 1, wherein said depositing comprises one of CVD (chemical vapor deposition), APCVD (atmospheric pressure chemical vapor deposition), ALD (atomic layer deposition), PECVD (plasma enhanced chemical vapor deposition), MOCVD (metal-organic chemical vapor deposition), and sputtering, and said solar cell substrate comprises one of glass, plastic and a flexible material, and
further comprising automatically transferring said solar cell substrate from said first chamber to said second chamber under vacuum in said multi-chamber manufacturing apparatus.

5. The method as in claim 1, wherein said exposing comprises exposing said solar cell substrate to light energy for a time between about 15-30 minutes.

6. The method as in claim 1, wherein said depositing at least one film comprises one of a) depositing a TCO film on said solar cell substrate then depositing solar cell films over said TCO film, wherein said solar cell substrate is transparent, and b) depositing solar cell films on said solar cell substrate then depositing a TCO film over said solar cell films.

7. The method as in claim 1, wherein the first light or the second light is infrared light or ultraviolet (UV) light.

8. The method as in claim 1, wherein exposing includes exposing to a first light having a first wavelength range from a first light source and exposing to a second light having a second wavelength range from a second light source.

9. The method as in claim 1, wherein said at least one film comprises a TCO film and wherein said exposing takes place for a time sufficient to reduce resistance of said TCO film without decreasing transmittance thereof.

10. A method for forming a solar cell, said method comprising:
providing a solar cell substrate;
depositing at least a TCO (transparent conductive oxide) film on said solar cell substrate in a first chamber of a multi-chamber manufacturing apparatus; and
exposing said solar cell substrate with said at least said TCO film thereon in a second chamber of said multi-chamber manufacturing apparatus, said second chamber including first and second light sources disposed on opposite sides of said solar cell substrate and said exposing including exposing to multiple wavelengths of light,
wherein said exposing includes sequentially exposing using a first light from said first light source with a first wavelength range for a first time period then a second light from said second light source with a second wavelength range for a second time period,
wherein the first light or the second light is a light in the range of from red light to near infrared or in the range of from blue light to ultraviolet (UV) light.

11. The method as in claim 10, wherein said depositing a TCO film comprises depositing an ITO (indium tin oxide) film.

12. The method as in claim 10, wherein said depositing at least a TCO film comprises depositing one of ITO, ZnO, AZO, BZO, GZO and indium-doped cadmium oxide on a CIGS solar cell film substructure.

13. The method as in claim 8, wherein said second light source is a lower light source positioned beneath said solar cell substrate, and further comprising a plurality of further second light sources positioned beneath said solar cell substrate, and further comprising automatically transferring said solar cell substrate from said first chamber to said second chamber under vacuum in said multi-chamber manufacturing apparatus.

14. The method as in claim 10, wherein said sequentially exposing includes sequentially exposing a first side of said solar cell substrate to said first light source and exposing an opposite side of the solar cell substrate to said second light source.

15. The method as in claim 10, further comprising automatically transferring said solar cell substrate from said first chamber to said second chamber under vacuum, in said multi-chamber manufacturing apparatus.

* * * * *